United States Patent
Schulze

[11] Patent Number: 6,042,972
[45] Date of Patent: Mar. 28, 2000

[54] PHASE SHIFT MASK HAVING MULTIPLE ALIGNMENT INDICATIONS AND METHOD OF MANUFACTURE

[75] Inventor: Steffen F. Schulze, Wappingers Falls, N.Y.

[73] Assignee: Siemens Aktiengesellschaft, Munich, Germany

[21] Appl. No.: 09/098,785

[22] Filed: Jun. 17, 1998

[51] Int. Cl.[7] .................................................. G03F 9/00
[52] U.S. Cl. ................................................ 430/5; 430/22
[58] Field of Search ............................................ 430/5, 22

[56] References Cited

U.S. PATENT DOCUMENTS

| | | | |
|---|---|---|---|
| 5,477,058 | 12/1995 | Sato ........................................ | 250/548 |
| 5,478,679 | 12/1995 | Loong et al. ............................... | 430/5 |
| 5,674,650 | 10/1997 | Dirksen et al. ............................ | 430/22 |
| 5,756,235 | 5/1998 | Kim .......................................... | 430/5 |
| 5,792,578 | 8/1998 | Tzu et al. ................................... | 430/5 |
| 5,863,677 | 1/1999 | Nakao ....................................... | 430/5 |

*Primary Examiner*—Christopher G. Young
*Assistant Examiner*—Saleha R. Mohamedulla
*Attorney, Agent, or Firm*—Stanton C. Braden

[57] ABSTRACT

A phase shifting mask having an alignment region, a plurality of first transparent regions, and a plurality of transparent phase shifting regions. The mask includes a transparent substrate having an opaque material disposed on selected portions of a surface of the substrate. The opaque material disposed on a first portion of the surface of the substrate has a cross-shaped space therein to expose an underlying portion of the surface of the substrate. A first line of the cross-shaped space provides a first one of a pair of first alignment detection indicia for the alignment detection region. A second line of the cross-shaped space provides a second one of a pair of first alignment detection indicia for the alignment detection region. The opaque material disposed on each one of a pair of second portions of the surface of the substrate has a plurality of spaces therein. Each one of the spaces in the second regions exposes a underling portion of the surface of the substrate. The spaces in a first one of the second regions are parallel to the first line of the cross-shaped space and the spaces in a second one of the second regions are parallel to the second line of the cross-shaped space. A pair of the plurality of transparent phase shifting regions is provided, each one thereof in a first one of the pair thereof is disposed in a corresponding one of the spaces in the first one of the second region and each one thereof in a second one of the pair thereof is disposed in a corresponding one of the spaces in the second one of the second regions. The transparent phase shifting regions in the pair thereof provide a pair of second alignment direction indicia for the alignment detection region.

24 Claims, 6 Drawing Sheets

# PHASE SHIFT MASK HAVING MULTIPLE ALIGNMENT INDICATIONS AND METHOD OF MANUFACTURE

BACKGROUND OF THE INVENTION

This invention relates generally to phase shift masks and more particularly to alignment detection indicia formed on such masks.

As is known in the art, phase shift masks are used to pattern semiconductors with submicron delineations. With phase shift masks, interference of light rays is used to provide a proper mask effect. The phase of the exposed light at the target is controlled such that bright areas are preferably formed 180 degrees out of phase with each other. Dark areas are thus produced between the bright areas by destructive interference.

In general, a phase shift mask is constructed with a repetitive pattern formed on three different distinct layers of material. An opaque layer, such as chrome, provides areas that allow no light transmission (i.e., a highly light reflective layer, or surface). A first transparent layer, such as quartz, provides areas which allow close to 100% of the light to pass through. A transparent phase shifting layer, such as areas etched a predetermined distance into the quartz, provides areas which allow close to 100% of the light to pass through but phase shifted 180 degrees from the light passing through the first transparent layer. The first transparent layer and the transparent phase shifting layer are positioned such that light rays diffracted through each area are canceled out in a darkened area between them. This creates a pattern of dark and bright areas which can be used to clearly delineate desired features on the semiconductor wafer.

Figure 1:
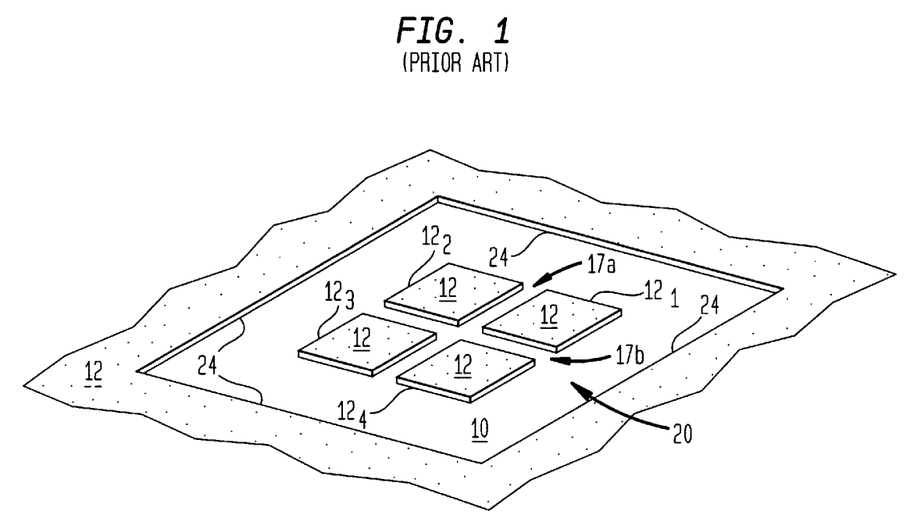
FIG. 1 is an isometric sketch of an alignment region of a phase shifting mask at a first step in the fabrication thereof according to the PRIOR ART.
Figure 1A:
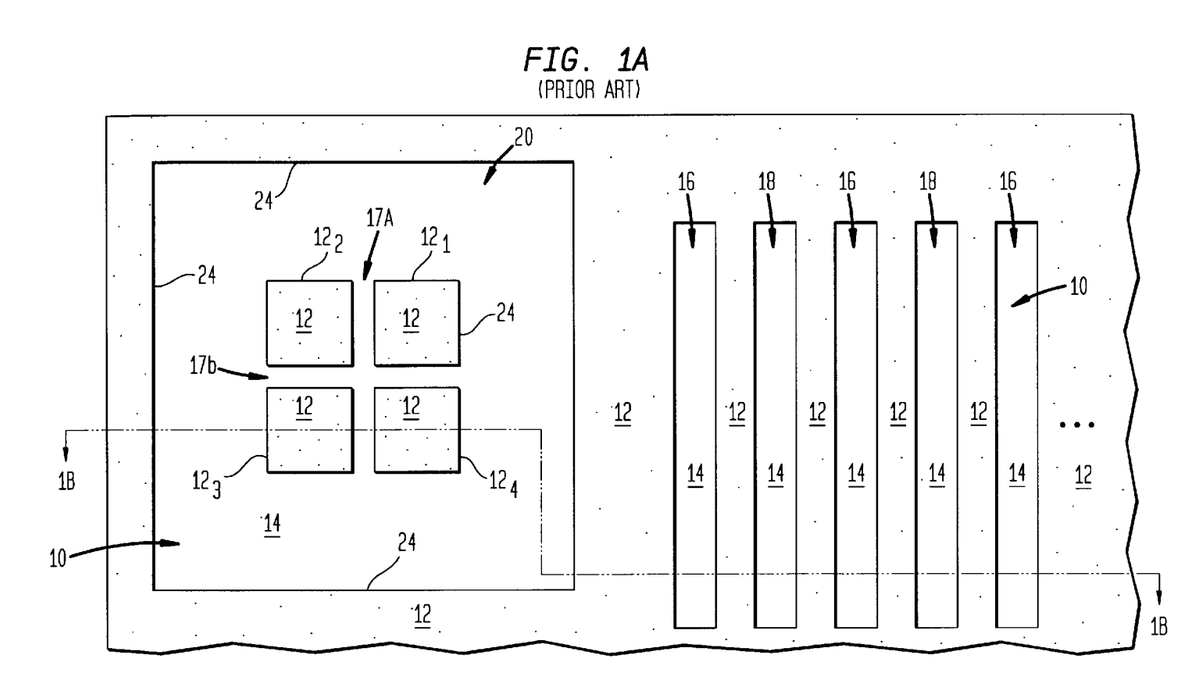
FIG. 1A is a plan view of a phase shifting mask at a first step in the fabrication thereof according to the PRIOR ART.
Figure 1B:
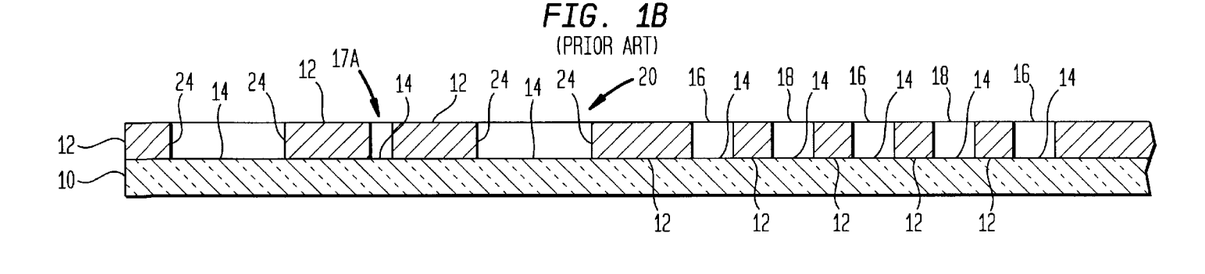
FIG. 1B is a cross-sectional elevation view of the phase shifting mask of FIG. 1A, such cross section being taken along line 1B—1B in FIG. 1A, according to the PRIOR ART.

One type of such phase shifting mask is formed by providing a quartz substrate 10 (FIGS. 1, 1A and 1B) having a chrome layer 12 formed on an upper surface thereof. A pattern of the described first transparent regions 16 and a first step in forming the transparent phase shifting regions 18 is etched (i.e., "written") into the chrome 12 to expose underlying top surface regions 14 of the quartz 10, as shown in FIGS. 1, 1A and 1B. It is noted that also written into the chrome 12 with the pattern is a first portion of an alignment detection region 20. The first portion of the alignment detection region 20 has a square chrome-quartz interface 24 with four, centrally disposed, square chrome patches $12_1$–$12_4$ arranged to form a cross-shaped region (i.e., a pair of intersection lines 17a, 17b) between the four square patches $12_1$–$12_4$.

Figure 2:
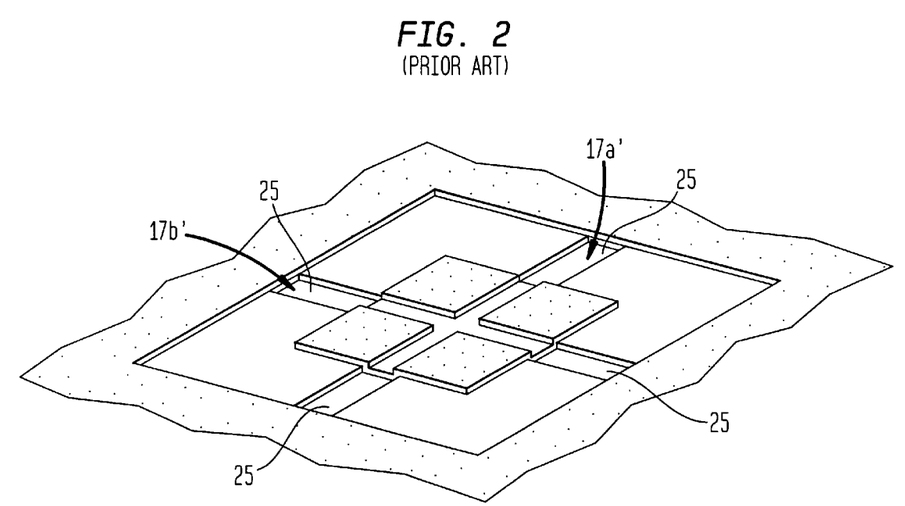
FIG. 2 is an isometric sketch of the completed alignment region of a phase shifting mask of FIG. 1 according to the PRIOR ART.
Figure 2A:
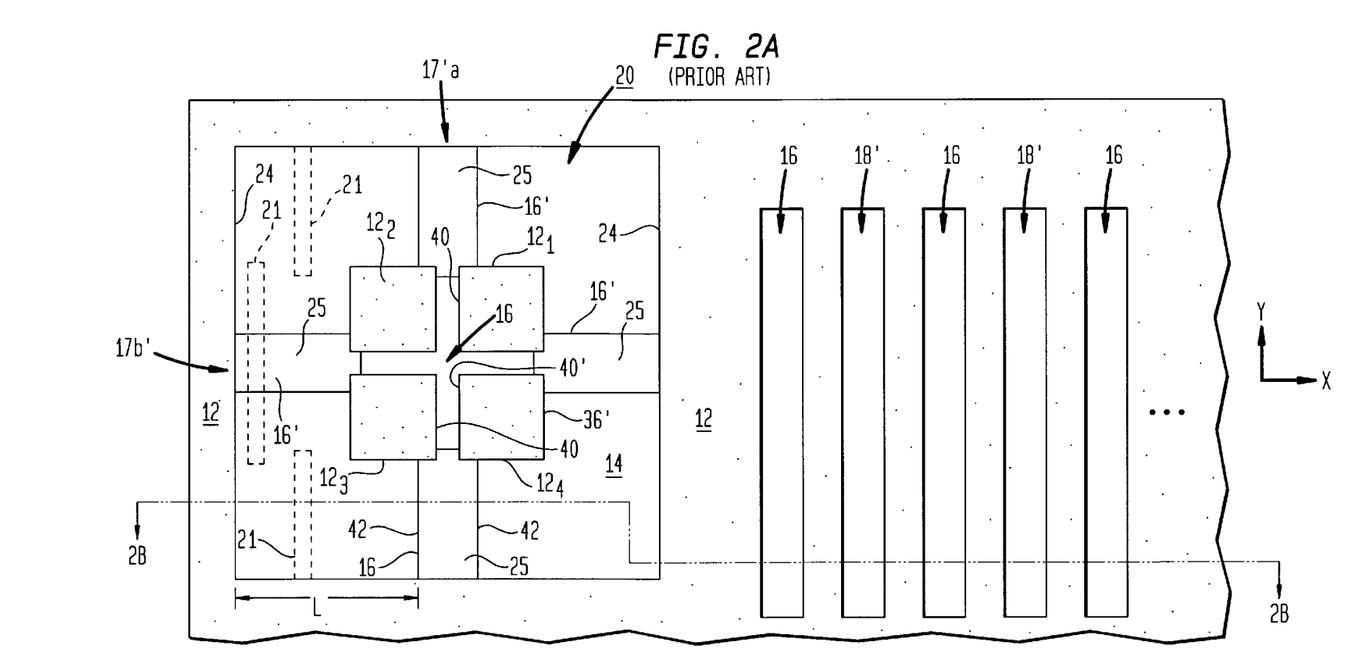
FIG. 2A is a plan view of the competed phase shifting mask, such mask having the alignment region of FIG. 1, according to the PRIOR ART.
Figure 2B:
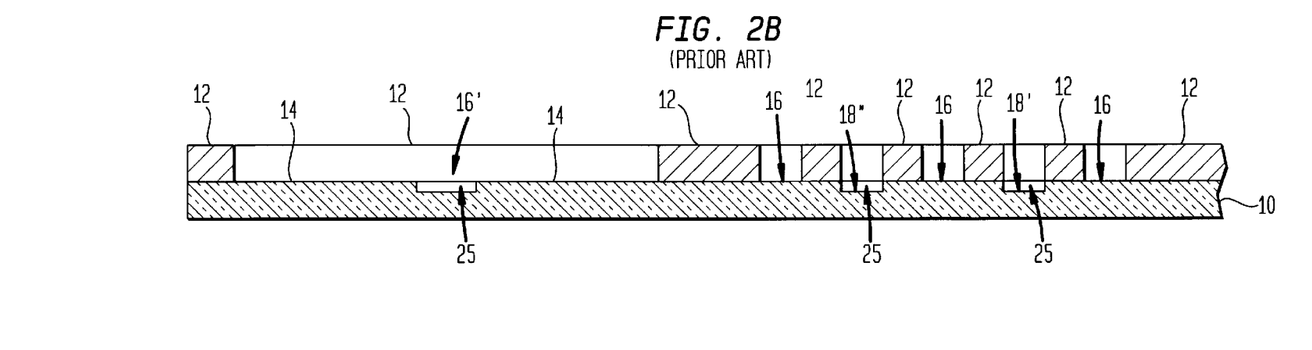
FIG. 2B is a cross-sectional elevation view of the phase shifting mask of FIG. 2A, such cross section being taken along line 2B—2B in FIG. 2A.

Next, the pattern of transparent phase shifting regions 18 is completed by etching the pattern of transparent phase shifting regions 18 formed in the first writing step (FIGS. 1. 1A, and 1B) into the underlying, upper surface regions, of the quartz 10 to form recesses 25 into the quartz 10, as shown in FIGS. 2, 2A and 2B. It is also noted that during this second writing step, a cross formed by lines 17'a, 17'b is etched into the upper surface portion of the quartz 10 of region 20, as shown in FIGS. 2A, 2B and 2. It is noted that if the two writing steps produce the transparent phase shifting regions 18 in proper alignment with the first transparent regions 16 the two crosses (i.e., the cross formed by lines 17a, 17b in the first write step, FIG. 1 and the cross formed by lines 17'a, 17'b in the second write step, FIG. 2) will be in alignment (i.e., registration) with each other. The amount of misalignment is determined by passing a light, not shown, through a slit 21 and moving the slit 21 across the surface of the alignment detection region 20 in two steps for each of two orthogonal directions, i.e., the X direction and the Y direction indicated in FIG. 2A.

Figure 2C:
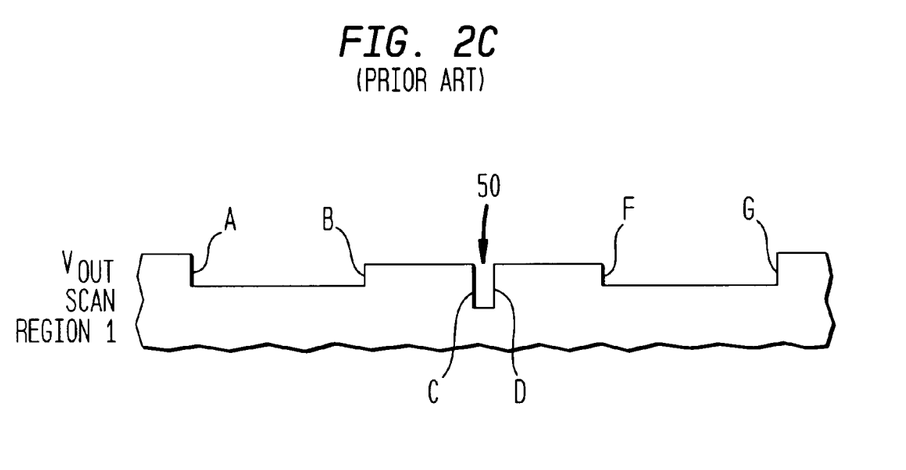
FIG. 2C is a time history of a voltage produced by reflections of light scanned across one region of the mask of FIGS. 2A and 2B according to the PRIOR ART.

During the first scanning step, the slit 21 is passed over the surface of the alignment detection region 20 along a first region (i.e., SCAN REGION 1) which passes over the central portion of the alignment detection region 20, i.e., over the four chrome patches $12_1$–$12_4$. The amount of light reflected by the surface of the alignment detection region 20 is detected and a voltage representative of the amount of such reflected light is produced as a function of time or distance along the alignment detection region 20, as shown in FIG. 2C. It is noted that the light is first reflected by the chrome surface bordering the alignment detection region 20, then by etched and un-etched surface portions of the quartz 10, then by the surfaces of the chrome patches $12_1$–$12_4$, then by the un-etched surface of the quartz 10 providing line 17a and then the reflections from the surfaces repeat in a symmetrical manner.

The voltage produced by such reflections in scanning SCAN REGION 1 is shown in FIG. 2C. It is noted that the level of the voltage has a first transition A at interface 24, a second transition B at the interface 36 between the leading edges of two patches $12_2$ and $12_3$ and etched quartz, a third transition C at the interface 40 between the trailing edges of the two patches $12_2$ and $12_3$ and the un-etched surface of the quartz 10 forming line 17a of the cross, a fourth transition D at the interface 40' between the leading edges of the two patches $12_1$ and $12_4$ and the un-etched surface of the quartz 10 forming the line 17a of the cross, a fifth transition f at the interface 36' between the trailing edges of patches $12_1$, $12_4$ and the un-etched quartz, and a sixth transition G at the interface 24.

Figure 2D:
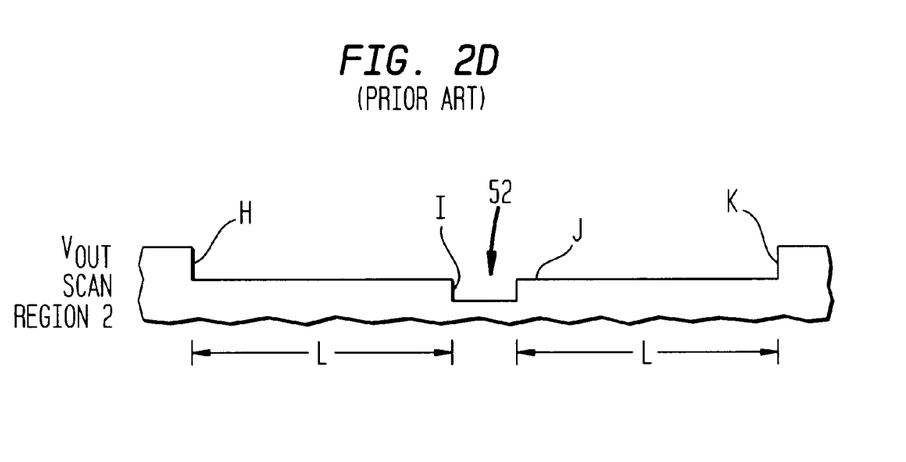
FIG. 2D is a time history of a voltage produced by reflections of light scanned across another region of the mask of FIGS. 2A and 2B according to the PRIOR ART.

During the second scanning step, the slit 21, or here pair of slits 21, is passed over the surface of the alignment detection region 20 along a pair of second regions (i.e, SCAN REGION 2) each of which pass over the outer peripheral portion of the alignment detection region 20, i.e., over the surface of the un-etched quartz from line 17'a, then over the surface of the etched quartz and then over the surface of the un-etched quartz. The amount of light reflected by the surface of the alignment detection region 20 is detected and a voltage representative of the amount of such reflected light is produced, as shown in FIG. 2D as a function of time or distance along the alignment detection region 20.

It is noted that the voltage has a first transition H at the interface 24, a second transition I at the interface 42 between the un-etched and etched quartz 10 forming the leading edge of line 17'a, a third transition J at the interface 42' between the un-etched and etched quartz 10 forming the trailing edge of line 17'a, and a fourth transition K at the interface 24.

It is noted that a first notch 50 in the voltage level produced during scanning the SCAN REGION 1 (FIG. 2C) is produced between transitions C and D when from scanning the line 17a of the cross formed during the first write the scan and second notch 52 in the voltage level produced during scanning the SCAN REGION 2 (FIG. 2D) is produced between transitions I and J when from scanning the line 17'a of the cross formed during the second write. Because the line 17a was produced during the same write step as the first transparent regions 16 and line 17'a was produced during the same write as the transparent phase shifting regions 18, if the first transparent portions 16 formed during the first write are properly aligned with the transparent phase shifting portions 18 completed in the second write, the notches 50, 52 will be aligned (i.e, centered) with respect to each other. The amount of deviation between the centers of the voltages notches 50, 52 provides an indication of the misalignment in the X direction. The two scanning steps are also provided along the Y direction to thereby provide a Y misalignment measurement.

In order to obtain sufficient contrast between reflections from the surface of the un-etched quartz and the etched quartz, (i.e., the transitions I and J in FIG. 2D) the scan in SCAN REGION 2 over the un-etched portion of the quartz surface must be sufficiently long to provide a relatively constant signal level against which reflections from the etched portion of the surface can be readily detected. Thus, a relatively large area of the underlying silicon semiconductor material will be exposed by light passing through the quartz. During subsequent photolithography, these large exposed areas result in relatively large trenches being formed in the silicon. These trenches must be at least partially filled and contaminants may become somewhat captured in the trench during a trench filling process. However, the contaminants may become loose and release thereof may adversely effect the devices being fabricated.

SUMMARY OF THE INVENTION

In accordance with the present invention, a phase shifting mask is provided having a transparent substrate with an opaque material disposed on the surface of the substrate. The reflective material is configured to provide a first alignment detection indication on a first portion of the surface. A second alignment detection indication is distributed among a plurality of spaced regions of a second surface portion of the substrate.

In accordance with another feature of the invention, a phase shifting mask is provided. The mask includes a transparent substrate having an opaque material on portions of a surface of the substrate. A space is provided in the reflective material on a first surface portion of the substrate to provide a first alignment detection indication. A plurality of spaces is provided in the opaque material on a second portion of the surface, each one of the plurality of spaces having therein a transparent indication. The transparent indication in the plurality of spaces provide a second alignment detection indication.

In accordance with another feature of the invention, a phase shifting mask is provided having an alignment detection region, a plurality of first transparent regions, and a plurality of transparent phase shifting regions. The mask has a transparent substrate with an opaque material disposed on selected portions of a surface of the substrate. The opaque material disposed on a first portion of the surface of the substrate has a space therein, such space providing a first alignment detection indication for the alignment detection region. The opaque material disposed on a second portion of the surface of the substrate has a plurality of spaces therein, the spaces in the second region. Each one of the spaces has therein a transparent indication. The transparent indication in the plurality of spaces provide a second alignment detection indication for the alignment detection region.

With such an arrangement, relatively little transparency is provided by the alignment detection region of the phase shift mask thereby reducing the size of any trenches which may be formed in a silicon wafer being fabricated by the phase shift mask.

In accordance with still another feature of the invention, a phase shifting mask is provided having an alignment region, a plurality of first transparent regions, and a plurality of transparent phase shifting regions. The mask includes a transparent substrate having an opaque material disposed on selected portions of a surface of the substrate. The opaque material disposed on a first portion of the surface of the substrate has a cross-shaped space therein to expose an underlying portion of the surface of the substrate. A first line of the cross-shaped space provides a first one of a pair of first alignment detection indication for the alignment detection region. A second line of the cross-shaped space provides a second one of the pair of first alignment detection indication for the alignment detection region. The opaque material disposed on each one of a pair of second portions of the surface of the substrate has a plurality of spaces therein. Each one of the spaces in the second regions expose an underlying portion of the surface of the substrate. The spaces in a first one of the second regions are parallel to the first line of the cross-shaped space and the spaces in a second one of the second regions are parallel to the second line of the cross-shaped space. A pair of the second alignment detection indication is provided. A first one of the pair of the second alignment detection indication includes a plurality of first transparent indication, each one thereof being disposed in a corresponding one of the spaces in the first one of the second regions. A second one of the pair of the second alignment detection indication includes a plurality of second transparent indication, each one thereof being disposed in a corresponding one of the spaces in the second one of the second regions. The plurality of first transparent indication provide a first one of a pair of second alignment detection indication for the alignment detection region and the plurality of second transparent indication provide the second one of a pair of second alignment direction indication for the alignment detection region.

In one embodiment, each one of the plurality of transparent phase shifting regions and each one of the etched indication comprise a recess etched into a portion of the surface of the substrate. The first and second lines of the cross-shaped space are disposed orthogonal to each other. The alignment detection region comprises four quadrants, a first one of the quadrants provides the first portion of the surface of the substrate, a second one of the quadrants provides a first one of the pair of second portions of the surface of the substrate, and a third one of the quadrants provides the second one of the pair of second portions of the surface of the substrate. The second and third quadrants are disposed adjacent to sides of the first quadrant. The spaces are elongated, being, after projection onto the substrate, less than a micron in width and several microns in length.

In accordance with another feature of the invention, a method is provided for forming a phase shifting mask. The method includes providing a transparent substrate with an opaque material on a surface of the substrate. The opaque material is patterned into a first alignment detection indication on a first region of the surface, a plurality of spaces in a second portion of the surface to expose a plurality of underlying porions of the surface of the substrate and first transparent regions in a third region of the surface. A second alignment detection indication is formed along with phase shifting regions, such phase shifting regions being interleaved with the first transparent regions, such second alignment detection indication being distributed among the plurality of spaced regions in the second portion of the surface.

In accordance with another feature of the invention, a method is provided for determining alignment of a first transparent region and a phase shifting region of a phase shifting mask. The method includes providing a transparent substrate with an opaque material on a surface of the substrate. The opaque material is patterned into a first alignment detection indication on a first region of the surface, a plurality of spaces in a second portion of the surface to expose a plurality of underlying portions of the surface of the substrate and first transparent regions in a third region of the surface. A second alignment detection indication is formed together with phase shifting regions, such phase shifting regions being interleaved with the first transparent regions, such second alignment detection indication being distributed among a plurality of spaced regions of the second portion in the surface. The first and second portions of the surface of the substrate are scanned to produce signals representative of energy reflected by the first and second alignment detection indications. The produced signals are scanned to determine a spatial deviation between the first and second alignment detection indications.

BRIEF DESCRIPTION OF THE DRAWING

These and other features of the invention, as well as the invention itself, will become more readily apparent when read together with the following detailed description taken together with the accompanying drawings, in which.

DESCRIPTION OF THE PREFERRED EMBODIMENTS

Figure 5:
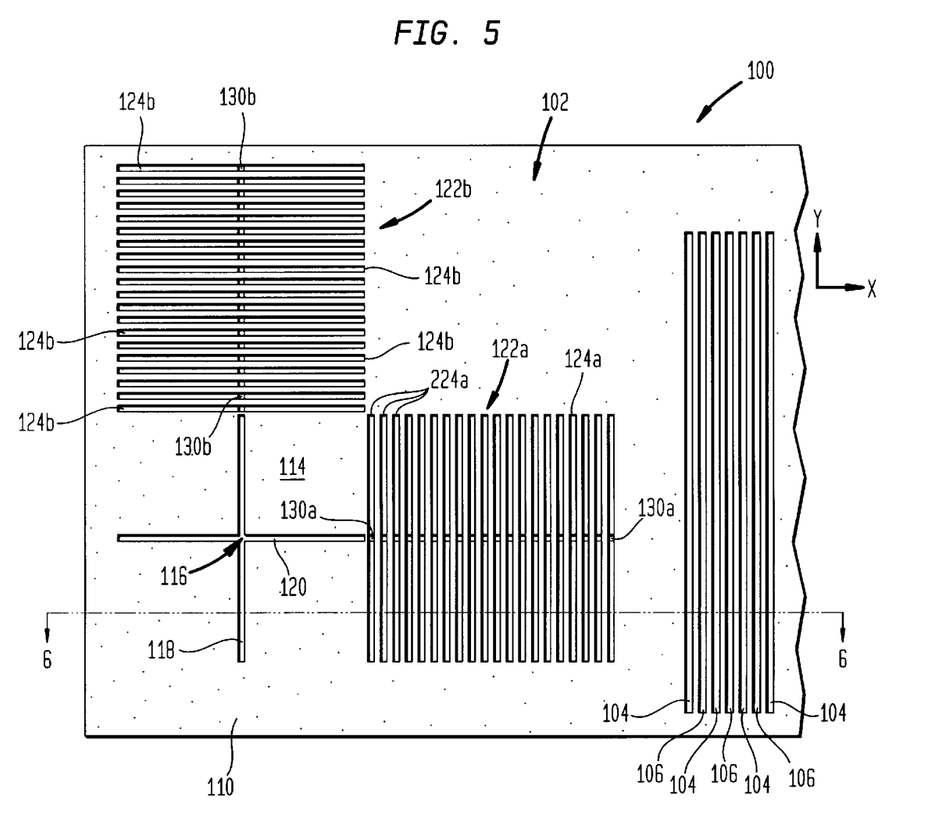
FIG. 5 is a plan view of the competed phase shifting mask, such mask having an alignment region in accordance with the invention.
Figure 6:
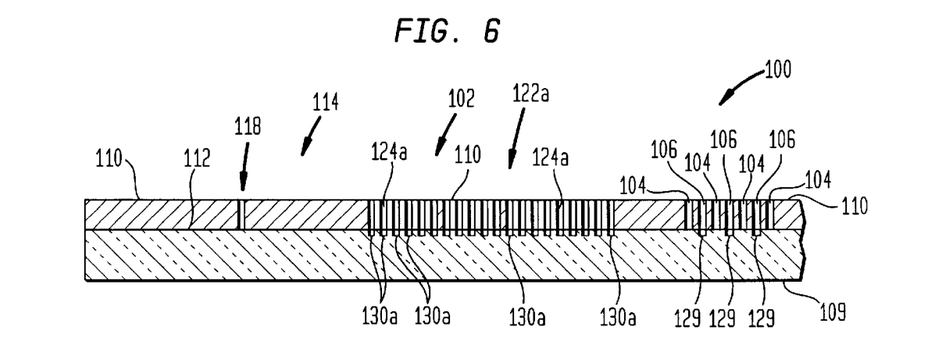
FIG. 6 is a cross-sectional elevation view of the phase shifting mask of FIG. 5, such cross section being taken along line 6—6 in FIG. 5.

Referring now to FIGS. 5 and 6, a phase shifting mask 100 is shown having an alignment region 102, a plurality of first transparent regions 104 interleaved with a plurality of transparent phase shifting regions 106. The mask 100 includes a transparent substrate 109, here quartz. An opaque material 110, here a reflecting material such as chrome, is disposed on selected portions of an upper surface 112 of the substrate 109. The opaque material 110 disposed on a first portion 114 of the surface 112 of the substrate 109 has a cross-shaped space 116 formed therein to expose an underlying portion of the surface 112 of the substrate 109. A first line 118 of the cross-shaped space 116 provides a first one of a pair of first alignment detection indication for the alignment detection region 102. A second line 120 of the cross-shaped space 116 provides a second one of the pair of first alignment detection indication for the alignment detection region 120. The opaque material 110 disposed on each one of a pair of second regions 122a, 122b of the surface 112 of the substrate 109 has a plurality of spaces 124a, 124b, respectively, formed therein. Each one of the spaces 124a, 124b in the second regions 122a, 122b expose an underlying portion of the surface 112 of the substrate 109. The spaces 124a in the a first one of the second portions (i.e., region 122a) are parallel to the first line 118 of the cross-shaped space 116 and the spaces 124b in a second one of the second portions (i.e., region 122b) are parallel to the second line 120 of the cross-shaped space 116.

A second alignment direction indication is provided for the alignment detection region 102 in the second regions 122a, 122b during formation of the transparent phase shifting regions 106. More particularly, the phase shifting regions 106 are formed as recesses 129 formed in the surface 112 of substrate 109, as shown in FIG. 6. During the same step that such recesses 129 are written into the substrate 109, recesses 130a, 130b are etched into the spaces 124a, 124b formed in the opaque material 110 in regions 122a, 122b, respectively. It is noted that the if the first transparent regions 104 are properly aligned with the transparent phase shifting regions 106, the recesses 130a will be disposed along the line 120 of cross region 116 and the recesses 130b will be disposed along line 118 of cross region 116.

Thus, a pair of the plurality of transparent indication is provided by the recesses 130a, 130b, respectively. Each one of the transparent indication 130a in a first one of the pair thereof is disposed in a corresponding one of the spaces 124a in the first one of the second regions 122a and each one of the transparent indication 130b in a second one of the pair thereof is disposed in a corresponding one of the spaces 124b in the second one of the second region 122b. The transparent indication 130a in the first one of the pair thereof provide a first one of a pair of second alignment direction indication for the alignment detection region 102 and the transparent indication 130b in a second one of the pair thereof provide a second one of a pair of second alignment direction indication for the alignment detection region 102.

The first and second lines 116, 118 of the cross-shaped space 116 are orthogonal to each other. The alignment detection region 102 comprises four quadrants. A first one of the quadrants is first region 114, a second one of the quadrants is the first one of the pair of second regions 122a, and a third one of the quadrants is the second one of the pair of second regions 122b. The second and third quadrants are disposed adjacent to sides of the first quadrant. The spaces 122a, 122b are elongated. The spaces 122a, 122b are, after projection onto the substrate, less than a micron in width, here 0.5 microns in width. The spaces 122a, 122b are, after projection onto the substrate, several microns in length, here about 9 microns in length.

Figure 3:
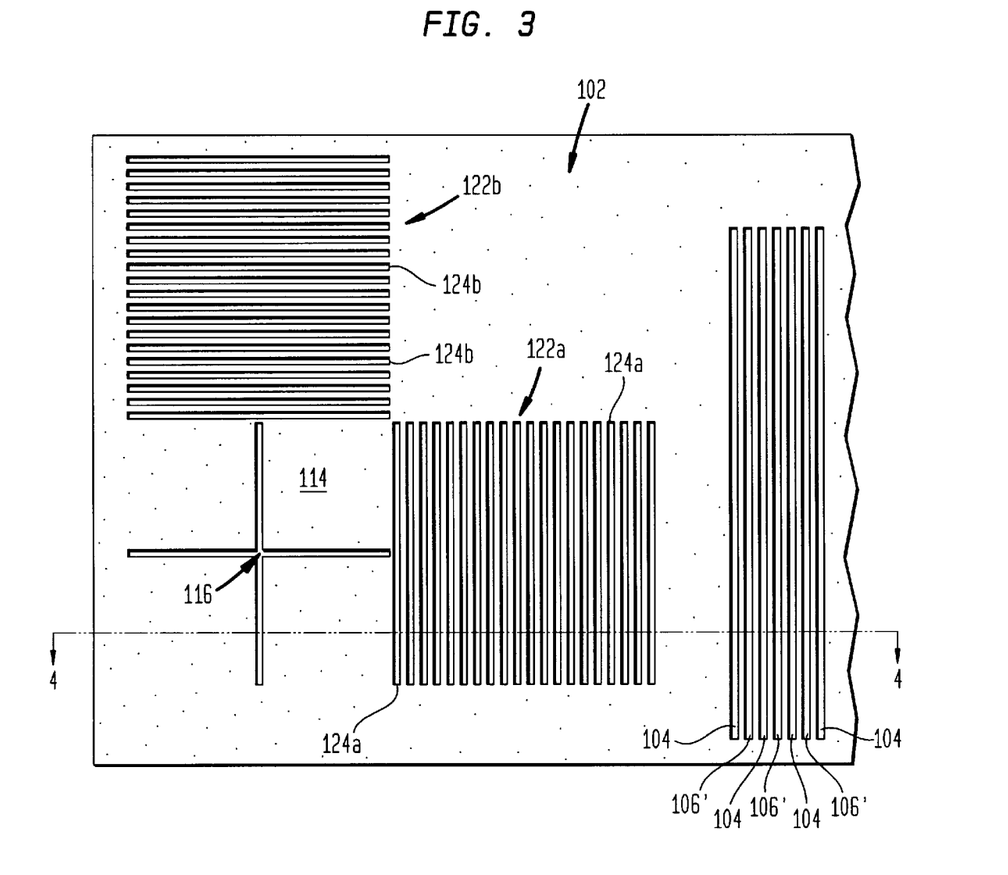
FIG. 3 is a plan view of a phase shifting mask at a first step in the fabrication thereof according to the invention.
Figure 4:
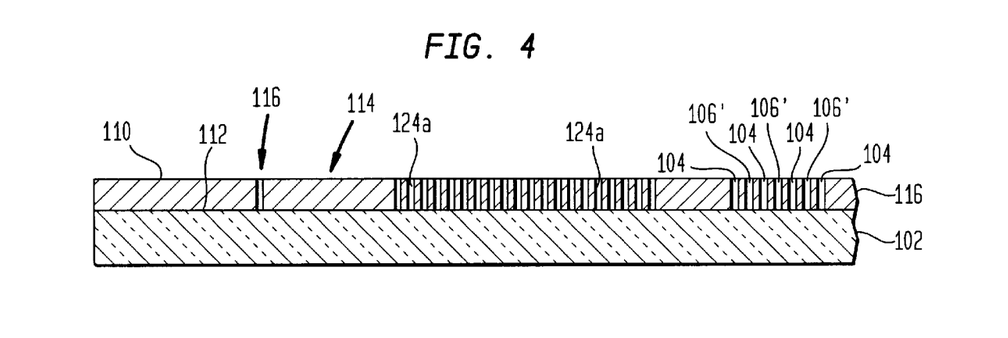
FIG. 4 is a cross-sectional elevation view of the phase shifting mask of FIG. 3 at the first stage in the fabrication thereof in accordance with the invention, such cross section being taken along line 4—4 in FIG. 3, according to the invention.

Referring now to FIGS. 3 and 4, the method of forming the mask 100 described above in connection with FIGS. 5 and 6 will be described. The method includes providing the transparent substrate 109 with the opaque material 110 on the surface 112 of the substrate 109. The opaque material 110 is patterned on selected portions of the surface 112 of the substrate 109. More particularly, the opaque material 110 is patterned on the first region 114 of the surface 112 of the substrate 109 with the cross-shaped space 116, with the spaces 124a, 124b formed in regions 122a, 122b, respectively, with the spaces for the first transparent regions 104 and with the spaces 106' interleaved with the spaces for the first transparent regions 104 to expose an underlying portion of the surface 112 of the substrate 109.

Next, during a second, subsequent step, the transparent phase shifting regions 106 are completed and, during the same step, the pair of second alignment detection indication 130a, 130b (FIGS. 5 and 6) are written, i.e., formed by etching recesses into portions of the surface 112 of substrate 109.

After forming the mask 100 (FIGS. 5 and 6), a method detects alignment of first transparent regions 104 and transparent phase shifting regions 106 of the phase shifting mask 100. The first region 104 is scanned along the X direction with a slit, such as slit 120 in FIG. 5, to produce, during such scan, a voltage representative of energy reflected by the reflective material 110 and by the line 118. It is noted that voltage will have a notch therein when the scanning slot passes over the line 118, i.e., one of the pair of first alignment detection indication.

Next, the region 122b is scanned in the X direction by the slit to produce, during such scan, a voltage representative of energy reflected by the reflective material 110, the un-etched surface 112 exposed by spaces 124b and by the recesses 130b in such spaces 124b. It is noted that a notch will be produced in the voltage when the scan passes over line spaces 124b, i.e., one of the pair of second alignment detection indication. It is noted that the combination of the chrome stripes and the un-etched quartz therebetween provide a composite, stable reflection reference background against which the reflections from the line formed by the etched quartz can be discriminated against. The two scans are then repeated along the Y axis over region 114 and then over region 122a to produce a second pair of voltages with notches therein when such scans are over line 120 and the recesses 130a. The voltages are processed to determine, form the notches therein, any spatial deviation between the first and second alignment detection indication.

Other embodiments are within the spirit and scope of the appended claims.

What is claimed is:

1. A phase shifting mask, comprising:
   a transparent substrate;
   an opaque material disposed on a first surface portion of the substrate and configured to provided a first alignment detection indication; and
   a second alignment detection indication comprising a plurality of recesses disposed in the substrate distributed among a plurality of spaced regions disposed on a second portion of the surface of the substrate.

2. A phase shifting mask, comprising:
   a transparent substrate;
   an opaque material having, on a first surface portion of the substrate, a space therein to provide a first alignment detection indication and having, on a second portion of the surface, a plurality of spaces therein, each one of the plurality of spaces having therein a transparent indication, such indication comprising recesses in the substrate, the transparent indication in the plurality of spaces providing a second alignment detection indication.

3. A phase shifting mask, comprising:
   a transparent substrate;
   an opaque material disposed on selected portions of a surface of the substrate;
   the opaque material disposed on a first portion of the surface of the substrate having a space therein, such space providing a first alignment detection indication, and;
   the opaque material disposed on a second portion of the surface of the substrate having a plurality of spaces therein, the spaces in the second region exposing underlying portions of the surface of the substrate and a plurality of transparent indication, the plurality of transparent indication comprising recesses in the exposed portions of the substrate, such plurality of recesses providing a second alignment detection indication.

4. A phase shifting mask having an alignment region, a plurality of first transparent regions, and a plurality of transparent phase shifting regions, such mask comprising:
   a transparent substrate;
   an opaque material disposed on selected portions of a surface of the substrate;
   the opaque material disposed on a first portion of the surface of the substrate having a space therein to expose an underlying portion of the surface of the substrate, such space providing a first alignment detection indication for the alignment region, and;
   the opaque material disposed on a second portion of the surface of the substrate having a plurality of spaces therein, each one of the spaces in the second region exposing underlying portions of the surface of the substrate and transparent indication, such transparent indication comprising recesses in the exposed portions of the substrate, such plurality of recesses providing a second alignment detection indication for the alignment region.

5. A phase shifting mask, comprising:
   a transparent substrate;
   an opaque material disposed on selected portions of a surface of the substrate, the opaque material disposed on a first portion of the surface of the substrate having a space formed therein to expose an underlying portion of the surface of the substrate and the opaque material a second portion of the surface of the substrate having a plurality of spaces therein, each one of the spaces in the second portion of the mask exposing underlying portions of the surface of the substrate and transparent indication, such transparent indication comprising a plurality of recesses in the exposed portions of the surface of the substrate, the transparent indication and the space in the opaque material disposed in the first region providing, respectively, first and second alignment detection indication.

6. A phase shifting mask having an alignment region, a plurality of first transparent regions, and a plurality of transparent phase shifting regions, such mask comprising:
   a transparent substrate;
   an opaque material disposed on selected portions of a surface of the substrate;
   the opaque material disposed on a first portion of the surface of the substrate having a cross-shaped space therein to expose an underlying portion of the surface of the substrate, a first line of the cross-shaped space providing a first one of a pair of first alignment detection indication for the alignment detection region, a second line of the cross-shaped space providing a second one of the pair of first alignment detection indication for the alignment detection region, and;

the opaque material disposed on each one of a pair of second portions of the surface of the substrate having a plurality of spaces therein, each one of the spaces in the second regions exposing a underlying portion of the surface of the substrate, the spaces in a first one of the second regions being parallel to the first line of the cross-shaped space and the spaces in a second one of the second regions being parallel to the second line of the cross-shaped space; and a pair of the plurality of transparent indication, each one of the plurality of transparent indication comprising a recess in the surface of the substrate, each one of the transparent indication in a first one of the pair thereof being disposed in a corresponding one of the spaces in the first one of the second region and each one of the transparent indication in a second one of the pair thereof being disposed in a corresponding one of the spaces in the second one of the second region, the transparent indication in the first one of the pair thereof providing a first one of a pair of second alignment direction indication for the alignment detection region and the transparent indication in a second one of the pair thereof providing a second one of a pair of second alignment direction indication for the alignment detection region.

7. The mask recited in claim 6 wherein the first and second lines of the cross-shaped space are orthogonal to each other.

8. The mask recited in claim 7 wherein the alignment detection region comprises four quadrants, and wherein a first one of the quadrants provides the first portion of the surface of the substrate, a second one of the quadrants provides a first one of the pair of second portions of the surface of the substrate, and a third one of the quadrants provides the second one of the pair of second portions of the surface of the substrate.

9. The mask recited in claim 8 wherein the second and third quadrants are disposed adjacent to sides of the first quadrant.

10. The mask recited in claim 9 wherein the spaces are elongated.

11. The mask recited in claim 10 wherein the spaces project as less than a micron in width.

12. The mask recited in claim 10 wherein the spaces project as several microns in length.

13. A method for forming a phase shifting mask, comprising:

providing a transparent substrate with an opaque material on a surface of the substrate;

patterning the opaque material on a first portion of the surface with a first alignment detection indication;

patterning the opaque material on a second portion of the surface with a second alignment detection indication, such second alignment detection indication comprising recesses in the surface of the substrate distributed among a plurality of spaced regions in the second portion of the surface of the substrate.

14. A method for forming a phase shifting mask, comprising:

providing a transparent substrate with an opaque material on a surface of the substrate;

patterning the opaque material on selected portions of a surface of the substrate, the opaque material being patterned on a first portion of the surface of the substrate with a space therein, such space providing a first alignment detection indication and the opaque material formed on a second portion of the surface of the substrate being patterned with a plurality of spaces therein, the spaces in the second region exposing underlying portions of the surface of the substrate;

forming a each one of a plurality of transparent indication comprising recesses in a corresponding one of the spaces in the second portion of the surface, the plurality of spaced transparent phase shifting regions providing a second alignment detection indication.

15. A method for forming a phase shifting mask, comprising:

providing a transparent substrate with an opaque material on a surface of the substrate;

patterning the opaque material into a first alignment detection indication on a first region of the surface, a plurality of spaces in a second portion of the surface to expose a plurality of underlying portions of the surface of the substrate, and first transparent regions in a third region of the surface; and forming a second alignment detection indication along with phase shifting regions, such phase shifting regions being interleaved with the first transparent regions, such second alignment detection indication comprising recesses distributed among the plurality of spaced regions in the second portion of the surface.

16. A method for forming a phase shifting mask having an alignment region, a plurality of first transparent regions, a plurality of transparent phase shifting regions, comprising:

providing a transparent substrate with an opaque material on a surface of the substrate;

patterning the opaque material on selected portions of a surface of the substrate, the opaque material being patterned on a first portion of the surface of the substrate with a space therein to expose an underlying portion of the surface of the substrate, such space providing a first alignment detection indication for the alignment region, and patterning the opaque material disposed on a second portion of the surface of the substrate with a plurality of spaces therein, each one of the spaces in the second region exposing an underlying portion of the surface of the substrate; and forming a transparent phase shifting region of the mask, comprising forming one portion of the phase shifting region in the plurality of spaced regions, each one of the portions of the phase shifting region being formed as a recess in a corresponding one of the spaces in the second portion of the surface of the substrate to provide a second alignment detection indication for the alignment region and forming another portion of the phase shifting regions in alternating ones of the spaces in the second portion of the surface of the substrate.

17. The method recited in claim 13 wherein the step of patterning the reflective material comprises providing a cross-shaped space therein to expose an underlying portion of the surface of the substrate, a first line of the cross-shaped space providing a first one of a pair of the first alignment detection indicia for the alignment detection region, a second line of the cross-shaped space providing a second one of the pair of the first alignment detection indicia for the alignment detection region, and patterning the opaque material disposed on each one of a pair of second portions of the surface of the substrate with a plurality of spaces therein, each one of the spaces in the second regions exposing a underling portion of the surface of the substrate, the spaces in a first one of the second regions being parallel to the first line of the cross-shaped space and the spaces in a second one of the second regions being parallel to the second line of the cross-shaped space; and wherein the step of forming the completing the formation of the partially formed transparent phase shifting regions comprises forming on a fourth portion of the surface a second alignment detection indica, such second alignment detection indica being distributed among a plurality of spaced regions.

18. The method recited in claim 17 wherein the step of forming each one of the plurality of transparent phase shifting regions comprises etching a recess into a portion of the surface of the substrate.

19. The method recited in claim 18 including the step of forming the first and second lines of the cross-shaped space orthogonal to each other.

20. The mask recited in claim 19 including the step of forming alignment detection region as four quadrants, and wherein a first one of the quadrants provides the first portion of the surface of the substrate, a second one of the quadrants provides a first one of the pair of second portions of the surface of the substrate, and a third one of the quadrants provides the second one of the pair of second portions of the surface of the substrate.

21. The mask recited in claim 20 wherein the second and third quadrants are formed adjacent to sides of the first quadrant.

22. The mask recited in claim 21 wherein the spaces are formed as elongated spaces.

23. The mask recited in claim 22 wherein the spaces are formed to project less than a micron in width.

24. The mask recited in claim 22 wherein the spaces are formed to project several microns in length.

* * * * *